United States Patent
Böschlin et al.

(10) Patent No.: US 7,427,792 B2
(45) Date of Patent: Sep. 23, 2008

(54) POWER TRANSISTOR INCLUDING A LEADFRAME AND A SEMICONDUCTOR CHIP ARRANGED ON THE LEADFRAME

(75) Inventors: Jean-Philippe Böschlin, Shanghai (CN); Alfons Graf, Kaufering (DE)

(73) Assignee: Infineon Technologies, AG, Neubiberg (DE)

( * ) Notice: Subject to any disclaimer, the term of this patent is extended or adjusted under 35 U.S.C. 154(b) by 0 days.

(21) Appl. No.: 11/214,047

(22) Filed: Aug. 30, 2005

(65) Prior Publication Data
US 2006/0076660 A1 Apr. 13, 2006

(30) Foreign Application Priority Data
Aug. 30, 2004 (DE) .................. 10 2004 041 904

(51) Int. Cl.
*H01L 27/108* (2006.01)
*H01L 29/76* (2006.01)
*H01L 29/94* (2006.01)
*H01L 31/119* (2006.01)

(52) U.S. Cl. ....................... 257/302; 257/401
(58) Field of Classification Search ............... 257/288, 257/401, 666–677, 901, 302
See application file for complete search history.

(56) References Cited

U.S. PATENT DOCUMENTS

| 5,293,056 | A | * | 3/1994 | Terashima | .......... 257/339 |
|---|---|---|---|---|---|
| 6,072,215 | A | * | 6/2000 | Kawaji et al. | .......... 257/334 |
| 6,114,768 | A | | 9/2000 | Gaul et al. | |
| 6,242,787 | B1 | * | 6/2001 | Nakayama et al. | .......... 257/493 |
| 6,414,389 | B1 | * | 7/2002 | Hume et al. | .......... 257/732 |
| 6,444,528 | B1 | * | 9/2002 | Murphy | .......... 438/270 |
| 2006/0017100 | A1 | * | 1/2006 | Bol et al. | .......... 257/331 |

FOREIGN PATENT DOCUMENTS

WO    WO 99/43027    8/1999

OTHER PUBLICATIONS

Peter Van Zant, Microchip Fabrication, 2000, Fourth Edition, p. 511.*

* cited by examiner

*Primary Examiner*—Monica Lewis
(74) *Attorney, Agent, or Firm*—Edell, Shapiro & Finnan, LLC

(57) ABSTRACT

A power transistor includes a leadframe and a semiconductor chip arranged on the leadframe. The top side of the semiconductor chip has a drain contact-making layer, and the underside of the semiconductor chip has a source contact-making layer. The source contact-making layer bears directly on the leadframe. A gate contact-making layer is provided on the top side of the semiconductor chip. The gate contact-making layer is electrically connected via at least one trench filled with conductive material to gate zones provided in the lower region of the semiconductor chip.

16 Claims, 6 Drawing Sheets

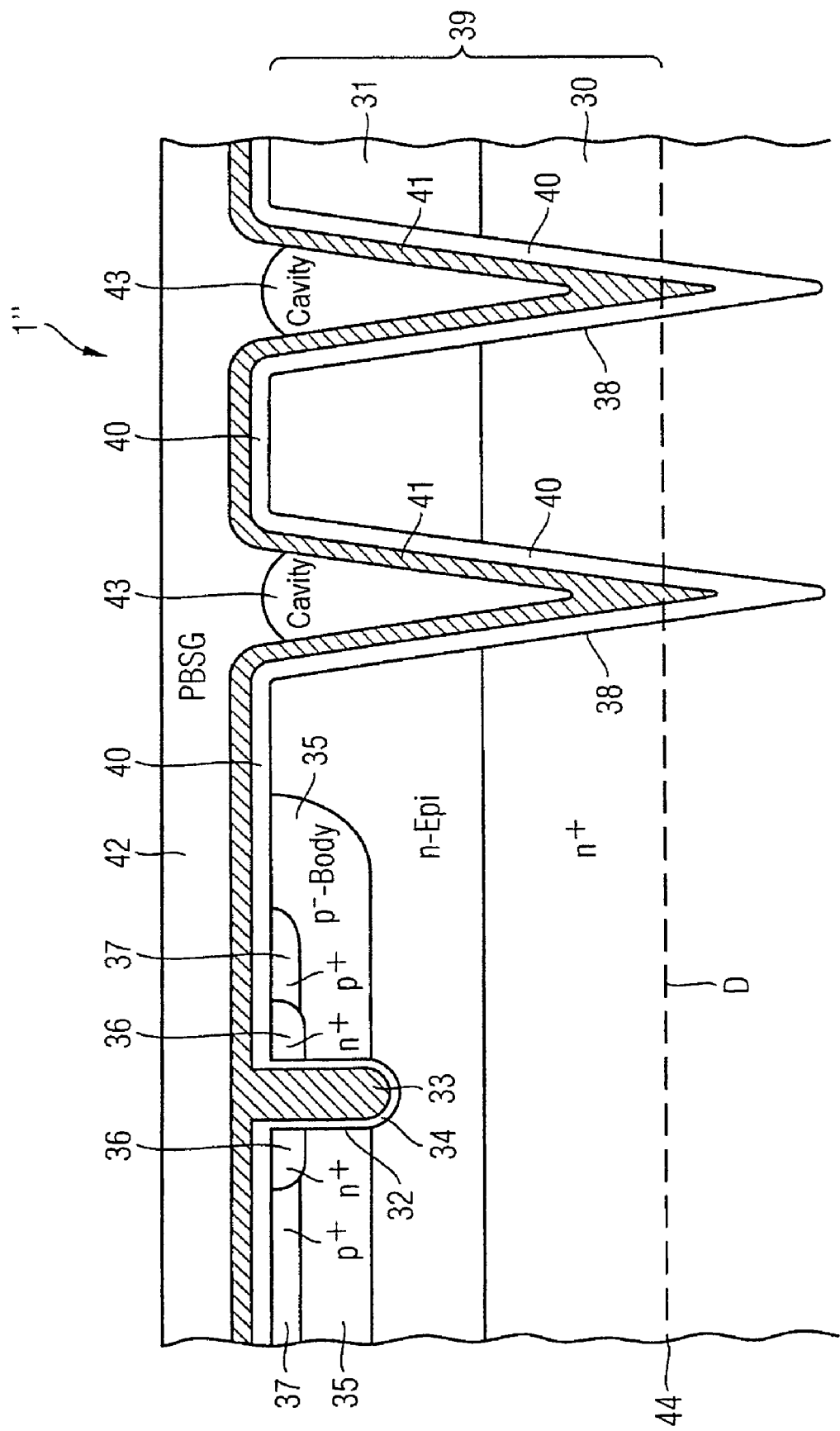

POWER TRANSISTOR INCLUDING A LEADFRAME AND A SEMICONDUCTOR CHIP ARRANGED ON THE LEADFRAME

CROSS REFERENCE TO RELATED APPLICATION

This application claims priority under 35 U.S.C. §119 to German Application No. DE 10 2004 041 904.3, filed on Aug. 30, 2004, and titled "Power Transistor," the entire contents of which are hereby incorporated by reference.

FIELD OF THE INVENTION

The invention relates to a power transistor with a leadframe and a semiconductor chip arranged on the leadframe.

BACKGROUND

Power transistors are usually mounted onto a leadframe, i.e., a metal carrier. The leadframe serves primarily for stabilizing the power transistor including a semiconductor chip. The leadframe is furthermore used for making contact with the semiconductor chip.

FIGS. 1A and 1B show an example of a power transistor mounted in this way. A power transistor 1 has a leadframe 2, a semiconductor chip 3 arranged on the leadframe 2, and a housing 4 that protects the semiconductor chip 3. An insulation layer 5 is provided beneath the leadframe 2 and electrically insulates the leadframe 2 from a heat sink 6. Contact is made with the top side of the semiconductor chip 3 via one or more bonding wires 7 led out from the housing 4 as connection 8. A source contact-making layer 9 and a gate contact-making layer 10, which are insulated from one another, are provided on the top side of the semiconductor chip 3. Contact is made with the gate contact-making layer 10 by one or more bonding wires 11 led out from the housing 4 as connection 12.

The power transistor 1 shown in FIGS. 1A and 1B is a vertical MOSFET (metal oxide semiconductor field effect transistor) configured as an n-channel transistor. In this example, the leadframe 2 forms the drain contact-making layer of the semiconductor chip 3 or serves as electrical connection of a drain contact-making layer formed on the underside of the semiconductor chip 3. The leadframe 2 is mechanically and electrically connected to the underside of the semiconductor chip 3 by soldering material or an adhesive.

FIG. 1C shows an applied example of the power transistor 1 shown in FIGS. 1A and 1B, a bridge circuit 20. In the bridge circuit 20, four transistors T1, T2, T3, T4 are connected to one another as shown. The power transistor identified by reference numeral T4 in this case corresponds to the power transistor 1 shown in FIGS. 1A and 1B.

What is disadvantageous about the power transistor 1 shown in FIGS. 1A and 1B is that when the power transistor is used as a low-side switch, the leadframe 2 is connected to an electrical load and thus has to be electrically insulated from the heat sink 6, which is generally at ground. If an insulation layer 5 of this type were not provided, an electrical short circuit would occur between the leadframe 2 and the heat sink 6. Accordingly, the insulation layer 5 is necessary and brings about additional costs, additional mounting complexity, and an impairment of the thermal cooling properties of the power transistor 1. The same problems occur, if the power transistor 1 is used in half-bridges or full-bridges.

In order to avoid this disadvantage, it is known, as shown in FIGS. 2A and 2B, to mount the semiconductor chip 3 onto the leadframe 2 such that the top side of the semiconductor chip 3 is formed by a drain contact-making layer 13 and the underside of the semiconductor chip 3 is formed by the source contact-making layer 9 and the gate contact-making layer 10. The semiconductor chip 3 is mounted onto the leadframe 2 in "reversed" fashion. In order to contact the source contact-making layer 9 and the gate contact-making layer 10, the leadframe 2 of the power transistor 1' shown in FIGS. 2A and 2B is divided into two parts, i.e., the leadframe includes a first part 2a and a second part 2b that are insulated from one another. The first part of the leadframe 2a is led out from the housing 4 via a connection 14, and the second part 2b of the leadframe is led out from the housing 4 via the connection 12. The bonding wires 7 contact the drain contact-making layer 13 of the semiconductor chip 3 and are led out from the housing 4 in the form of the connection 8.

If the power transistor 1' is used as a low-side switch, the power transistor 1' omits the insulation layer 5 between the leadframe 2 and the heat sink 6, i.e., insulation between the first part 2a of the leadframe 2 and the heat sink is omitted, and the second part 2b of the leadframe is electrically insulated from the heat sink 6. The insulation layer 5 is no longer necessary since both the source contact-making layer 9, i.e., the underside of the semiconductor chip 3, and the first part 2a of the leadframe are at ground, whereby no potential difference occurs between the underside of the semiconductor chip 3 and the heat sink 6 (which is also at ground).

In this case, the semiconductor chip 3 is applied to the leadframe 2 by diffusion soldering processes or adhesive-bonding processes; conventional soldering processes are virtually never used. The drain contact-making layer 13 is electrically connected to the connection 8 by applying bonding wires or by soldering with an iron.

FIG. 2C discloses another example of the power transistor 1' shown in FIGS. 2A and 2B, which corresponds to the bridge circuit example shown in FIG. 1B.

A disadvantage of the power transistor 1' shown in FIGS. 2A and 2B is that contact is made with the underside of the semiconductor chip 3 by a leadframe divided into two parts, which is relatively complicated to produce, rather than by wire bonding processes that can be carried out in a simple manner (see above). It would be desirable to contact the drain contact-making layer 13 and the gate contact-making layer 10 equally by a wire bonding contact method that can be carried out in a simple manner.

A power transistor that does not require an insulation layer between the leadframe and the heat sink and provides contact in a simple manner is desirable.

SUMMARY

A power transistor according to the invention has a leadframe and a semiconductor chip arranged on the leadframe. A drain contact-making layer is provided on the top side of the semiconductor chip, and a source contact-making layer is provided on the underside of the semiconductor chip. The source contact-making layer bears directly on the leadframe, i.e., is in direct electrical contact with the latter. A gate contact-making layer is provided on the top side of the semiconductor chip. The gate contact-making layer is electrically connected via at least one trench filled with conductive material to gate zones provided in the lower region of the semiconductor chip.

As a result of providing trenches filled with conductive material, the gate contact-making layer is "shifted" from the underside of the semiconductor chip to the top side thereof. Therefore, when the power transistor is used as a low-side switch, to contact with drain contact-making layer and the gate contact-making layer is possible without the an insulation layer between the leadframe and a heat sink (at ground) provided under the leadframe.

The semiconductor chip's underside bearing on the leadframe has a single large-area connection, the source contact-making layer. Gate zones or gate contact-making layers are no longer present on the underside of the semiconductor chip.

As already mentioned, the power transistor according to the invention can be used as a low-side switch, where the potential of the leadframe is at ground.

A heat sink is usually provided beneath the leadframe, and dissipates power loss generated in the semiconductor chip to the surroundings. If the leadframe has sufficiently large dimensions, then the heat sink may also be omitted or the heat sink and the leadframe may be configured as a common conductive unit (i.e., one-piece metal structure).

BRIEF DESCRIPTION OF THE DRAWINGS

The invention is explained in more detail below in exemplary embodiment with reference to the figures, in which:

FIG. 4 is a cross-sectional view of an exemplary embodiment of trenches that form an electrical connection between gate zones on an underside of the semiconductor chip and a gate contact-making layer on a top side of the semiconductor chip.

In the figures, identical or mutually corresponding parts or regions are identified by the same reference numerals. Furthermore, each of the exemplary embodiments may be doped inversely, i.e., that n-type and p-type regions may be interchanged with one another.

DETAILED DESCRIPTION

Figure 1A:
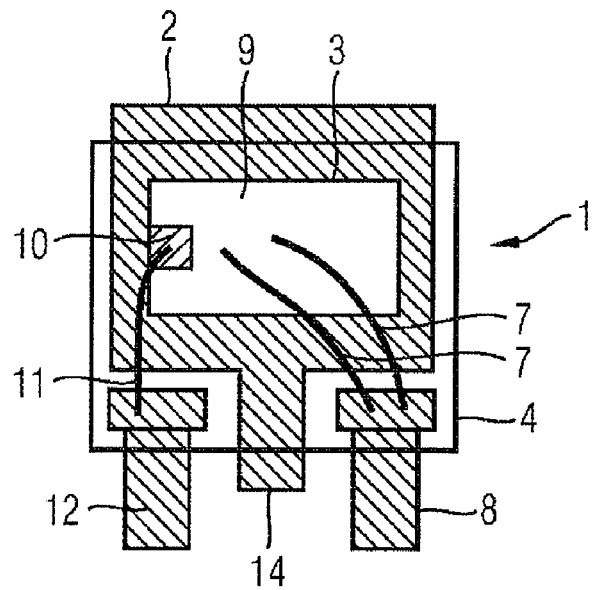
FIG. 1A is a plan view of a known power transistor in which a source contact-making layer and a gate contact-making layer are formed on the top side of a semiconductor chip, and a drain contact-making layer is formed on the underside of the semiconductor chip.
Figure 1B:
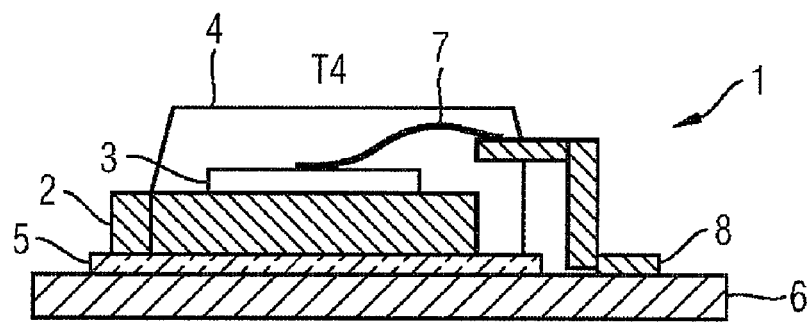
FIG. 1B is a cross-sectional view of the power transistor shown in FIG. 1A.
Figure 1C:
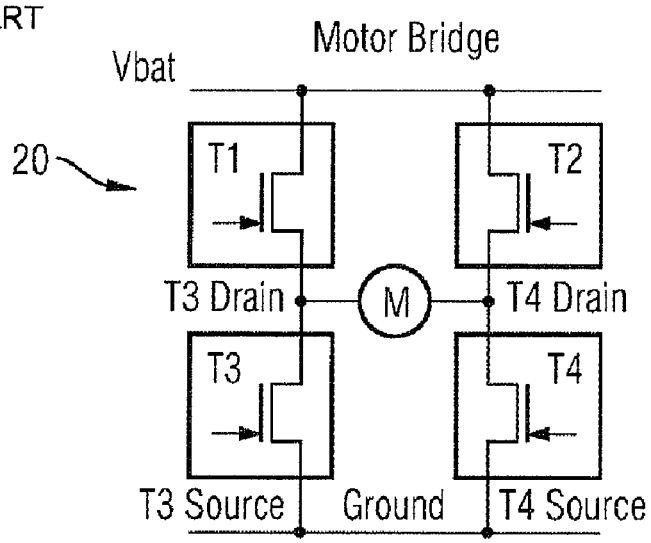
FIG. 1C is an example of an application of the power transistor shown in FIGS. 1A and 1B as a bridge circuit.
Figure 2A:
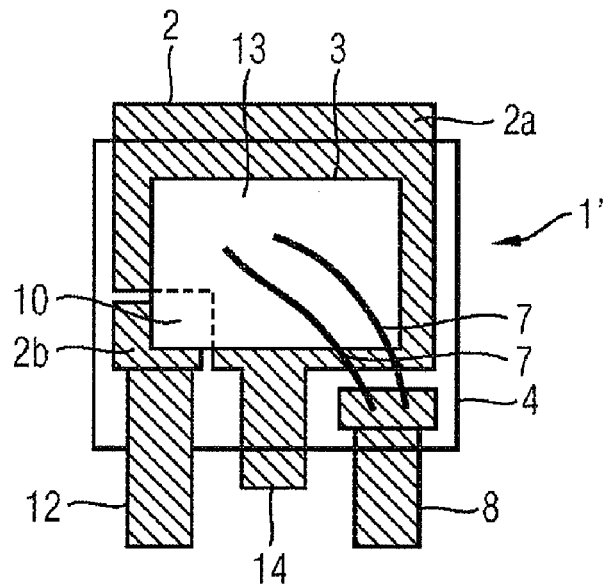
FIG. 2A is a plan view of another example of a known power transistor in which a drain contact-making layer is provided on the top side of a semiconductor chip, and a source contact-making layer and a gate contact-making layer are provided on the underside of the semiconductor chip.
Figure 2B:
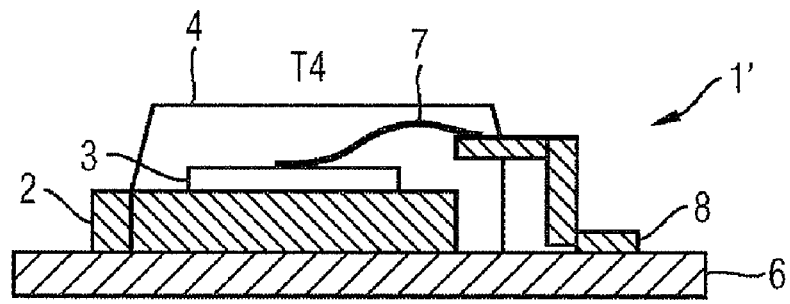
FIG. 2B is a cross-sectional view of the power transistor shown in FIG. 2A.
Figure 2C:
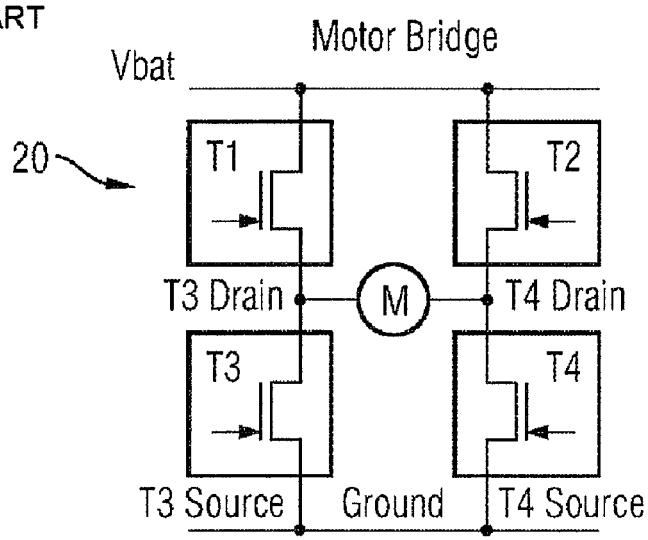
FIG. 2C is an example of an application of the power transistor shown in FIGS. 2A and 2B as a bridge circuit.
Figure 3A:
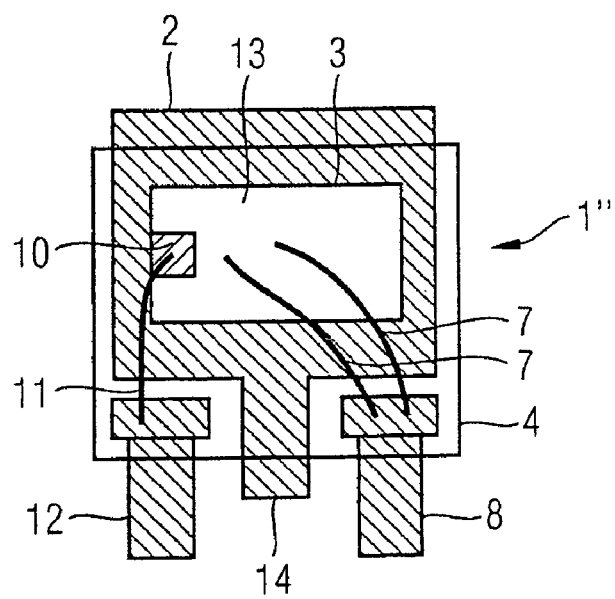
FIG. 3A is a plan view of an exemplary embodiment of the power transistor according to the invention.
Figure 3B:
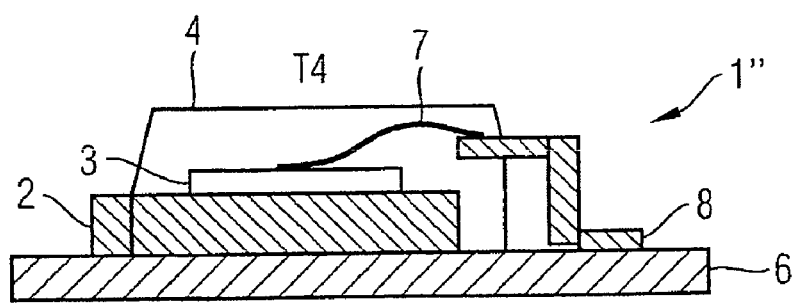
FIG. 3B is a cross-sectional view of the power transistor shown in FIG. 3A.

FIGS. 3A and 3B illustrate an exemplary embodiment of the power transistor according to the invention. A power transistor 1" has a leadframe 2, a semiconductor chip 3 arranged on the leadframe 2, and a housing 4 that protects the semiconductor chip 3. Contact is made with the top side of the semiconductor chip 3 via one or more bonding wires 7 led out from the housing 4 as connection 8. A drain contact-making layer 13 and a gate contact-making layer 10, which are insulated from one another, are provided on the top side of the semiconductor chip 3. Contact is made with the gate contact-making layer 10 by one or more bonding wires 11 led out from the housing 4 as connection 12.

The power transistor 1" shown in FIGS. 3A and 3B is a vertical MOSFET (metal oxide semiconductor field effect transistor) configured as an n-channel transistor. In this example, the leadframe 2 forms the source contact-making layer of the semiconductor chip 3 or serves as electrical connection of a source contact-making layer formed in the semiconductor chip 3. The leadframe 2 is mechanically and electrically connected to the underside of the semiconductor chip 3 by solder material or an adhesive.

Figure 3C:
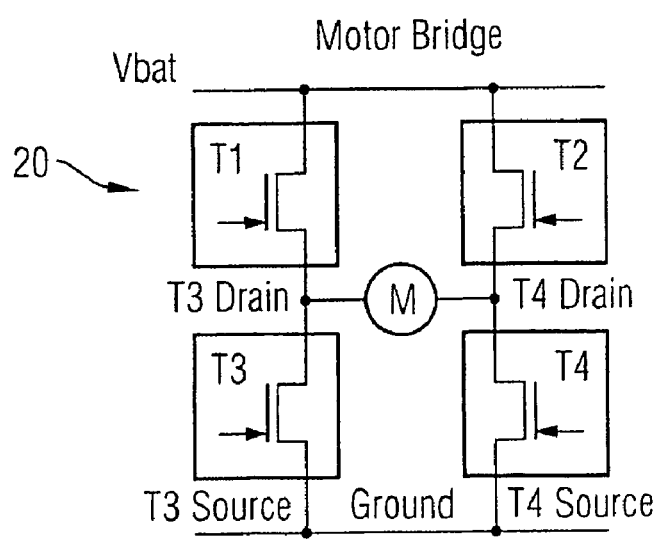
FIG. 3C is an example of an application of the power transistor shown in FIGS. 3A and 3B as a bridge circuit.

FIG. 3C shows an example of the power transistor 1" shown in FIGS. 3A and 3B, as a bridge circuit. In a bridge circuit 20, four transistors T1, T2, T3, T4 are connected to one another as shown. The power transistor identified by reference numeral T4 in this case corresponds to the power transistor 1" shown in FIGS. 3A and 3B.

FIG. 4 is a cross-section view of a partial region of a power transistor according to the invention. The illustration shows an $n^+$-doped substrate 30, on which an n-doped epitaxial layer 31 is arranged. A plurality of cell array trenches 32 are formed in the epitaxial layer 31 (only one cell array trench can be seen here). Electrodes 33 made of polysilicon being formed within the trenches. The electrodes 33 are insulated from the semiconductor region that adjoins the cell array trenches 32 by an insulation layer 34 (gate insulation layer). $P^-$-doped body regions 35 and also $n^+$-doped source regions 36 are shown within the epitaxial layer 31. $P^+$-doped contact-making regions 37 for contacting the body region 35 are provided.

According to the invention, contact-making trenches 38 are provided in the power transistor 1". The contact-making trenches are substantially deeper than the cell array trenches 32 and the depth of the contact-making trenches are designed so that, after a process of thinning by grinding, the thickness of the semiconductor body 39 of the power transistor 1" is smaller than the depth of the contact-making trenches 38. The inner walls of the contact-making trenches 38 are lined with a thick insulation layer (for example, an oxide layer) 40, on which is arranged, in turn, a layer made of conductive material 41 (for example, polysilicon). The conductive layer 41 is electrically connected to the electrodes 33 within the cell array trenches 32. The power transistor 1" is terminated towards the top by a layer made of PBSG (phosphorus-boron-silicon glass). Due to the dictates of the method, cavities 43 may form within the contact-making trenches 38 during deposition of the passivation layer 42. The electrical connections of the source regions 36 and the contact-making regions 37 are omitted for the sake of simplicity.

Figure 5:
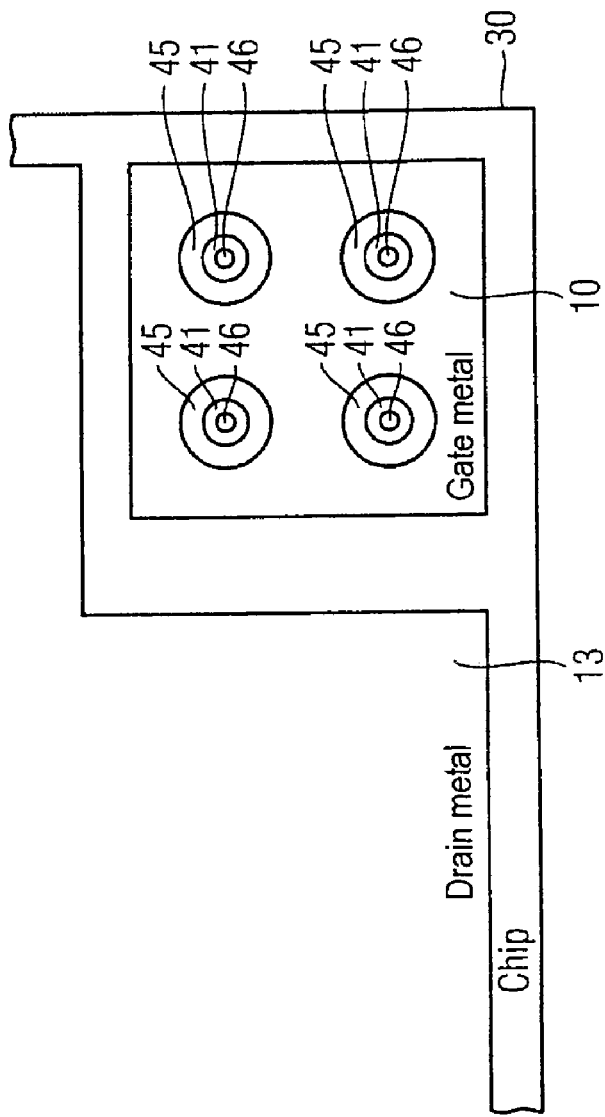
FIG. 5 is a plan view of a part of the top side of the semiconductor chip of the exemplary embodiment of the power transistor shown in FIGS. 3A and 3B.
Figure 6:
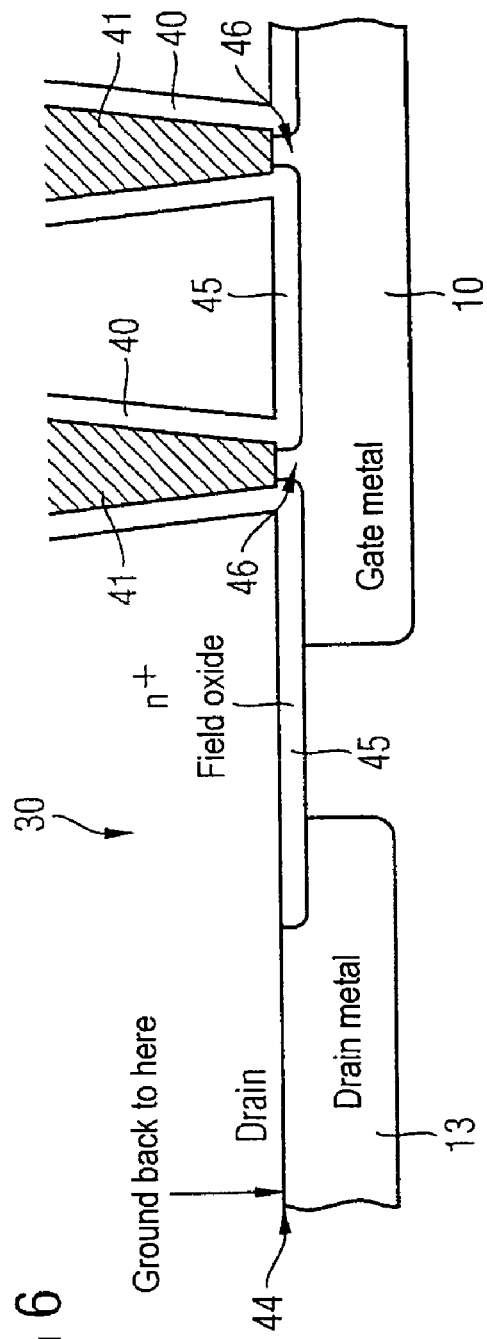
FIG. 6 is a cross-sectional view of a transition region between the top side of the semiconductor chip and the trenches that are formed underneath and form the electrical connection to the gate zones.

Proceeding from the process stage shown in FIG. 4, the substrate 30 is ground back to a level identified by reference numeral 44, as shown in FIG. 6. This means that the lower regions of the contact-making trenches 38 are likewise removed, so that the conductive layer 41 is uncovered on the underside of the power transistor 1". In the region of the contact-making trenches 38, a thick insulation layer 45 is then applied to the underside of the power transistor 1", contact holes 46 are introduced into the insulation layer 45, and a gate contact-making layer 10 is subsequently applied to the insulation layer 45 such that the polysilicon within the contact-making trenches 38 is electrically connected to the gate contact-making layer 10. Furthermore, a drain contact-making layer 13 is applied to the remaining part of the underside of the power transistor 1". The drain contact-making layer is electrically insulated from the gate contact-making layer 10 by the insulation layer 45. A plan view of the structure shown in FIG. 6 (i.e., a plan view of the underside of the power transistor 1") is shown in FIG. 5.

The power transistor 1" is mounted onto the leadframe 2 in "reversed" fashion, i.e., with the drain contact-making layer 13 and the gate contact-making layer 10 facing upwards.

Further aspects of the invention will be explained in greater detail below.

FIG. 6 illustrates how the through-plating for the gate connection may be embodied. The figure shows an n-channel MOSFET in trench technology, constructed on an $n^+$-type substrate with an n-type epitaxial layer. The trench gate is made of polysilicon.

In addition to the trench depressions, further depressions in the form of conical holes are produced in the original front side of the chip, e.g., by etching. The depth of the holes is substantially greater than that of the trenches and is 100 to 200 μm. The original front side of the chip and the sidewalls of the holes are provided with thick oxide that should satisfy drain-gate voltage requirements. Above the oxide, polysilicon is deposited both on the front side of the chip and in the holes. The polysilicon is simultaneously connected to the polysilicon of the trench gates. For further protection, the front side is covered with boron-phosphorus glass, for example. Due to the dictates of the method, cavities may form in the unfilled conical holes, but the cavities are not necessary in accordance with the invention.

In order to form conductive holes as plated-through holes, the original rear side is ground back as far as the line specified. A thick oxide layer is then applied and provided with openings. Through these openings or contact holes, the subsequent rear-side metallization can then contact the polysilicon of the contact cone that has emerged at the rear side. The connections for drain and gate are formed by patterning the rear-side metal (see FIG. 5 and FIG. 6). On the original front side, the source connection is formed by applying and patterning metal. The gate on the front side is insulated from the source surface (that side of the semiconductor body of the semiconductor chip which faces the source contact).

In specific applications, the gate has a defined series resistance, for example, when electromagnetic interference (EMC) is to be avoided. Such a series resistance may be supplementarily connected externally realized internally, i.e., within the transistor (MOSFET), in the form of an additional gate resistor structure with a larger area outlay. In an exemplary embodiment of the invention, the series resistance is integrated into the chip. The layer thickness of the polysilicon in the plated-through holes (trench 38) or the number of plated-through holes is set in a targeted manner such that a specific series resistance results.

The plated-through holes may alternatively also be produced by etching holes and subsequently filling them with thick oxide and, e.g., with copper instead of polysilicon. Corresponding production methods are known to the person skilled in the art.

A further method for producing the plated-through holes consists in using a laser, e.g., $CO_2$ laser, to burn holes having a diameter of approximately 10 to 50 μm into the wafer at the positions at which the plated-through holes are to be produced. Afterwards, the side walls of the holes are coated with a thick insulator (oxide). An etching process for cleaning and eliminating defects may take place beforehand. In a further process step, the conductive through-plating is then produced, i.e., on the original front side, the gate made of polysilicon is conductively connected to the gate connection on the rear side of the wafer by a connection. The connection may include, for example, polysilicon or metal (Cu). The holes may either be conductively coated on the side wall or filled.

The above-description applies analogously to vertical power switches. In the case of vertical p-channel MOSFETs that are used as high-side switches, the drain connection likewise bears on the leadframe and is connected to the load output. Two p-channel high-side switches thus cannot be mounted onto a heat sink without insulation. As a result of turning over the chip and simultaneously contacting the gate by through-plating, the source is then situated on the leadframe. Therefore, a plurality of high-side switches can be mounted on a common heat sink with a positive supply connection.

The invention can be applied analogously to IGBT transistors and bipolar transistors, for example, in the context of bridge circuits.

The method can be applied to n-channel MOSFETs, in particular. According to the invention, the semiconductor chip is turned over, so that the original front side contacts the leadframe and forms the source connection. The leadframe can be connected to earth directly for cooling purposes in the case of low-side switches as source connection. Multiple low-side switches can be realized by a plurality of chips on a leadframe. This also applies to bridge structures. If contact is made with the gates by through-plating through the chip, a gate connection is formed on the original rear side beside the customary large-area drain connection. The through-plating may be embodied in the form of conical holes that are completely or partially filled with metal (copper). The holes may be produced by an etching process. The holes may be produced by laser irradiation. The original front side of the chip has one large-area connection (source). The original front side of the chip is contact-connected to the leadframe by a standard soldering process, diffusion soldering, or adhesive bonding. Contact can be made with drain and gate on the "new" top side of the chip (original rear side) by known methods such as, e.g., wire bonding. A gate resistance can be integrated by varying the plated-through holes. The invention is suitable for customary chip mounting variants, soldering, diffusion soldering, adhesive bonding, wire bonding, or iron soldering. The invention is suitable, in particular, for thin chips. The invention can be applied analogously in p-channel MOSFETs, especially in high-side or bridge applications.

Figure 7:
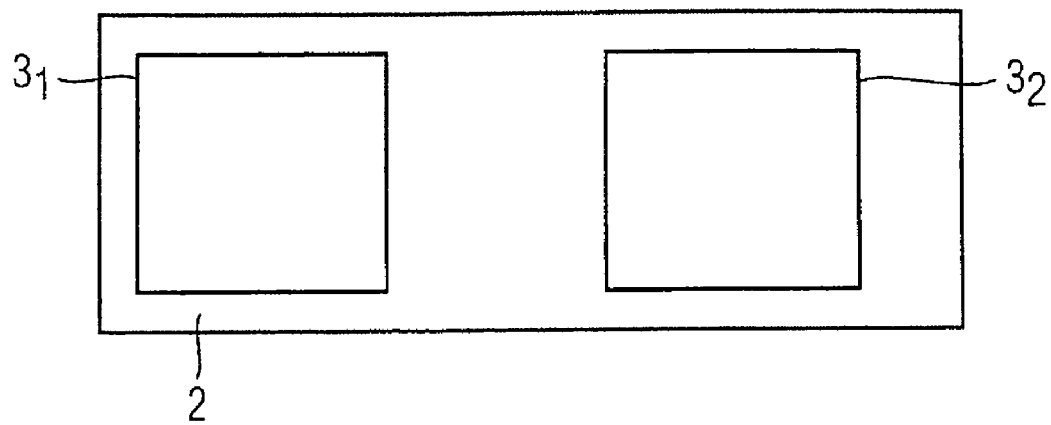
FIG. 7 is a plan view of another exemplary embodiment of a power transistor according to the invention.

FIG. 7 is a plan view of an exemplary embodiment of the power transistor according to the invention. In this embodiment, two semiconductor chips $3_1$, $3_2$ are applied on a common leadframe 2, corresponding source contact-making layers of the semiconductor chips $3_1$, $3_2$ bearing directly on the common leadframe 2. Any number of semiconductor chips can also be used, instead of two semiconductor chips. In this embodiment, the common leadframe 2 is grounded. Each of the semiconductor chips $3_1$, $3_2$ serves as a low-side switch for switching a load. A drain contact layer is formed on the top side of each semiconductor chip $3_1$, $3_2$. The drain contact layer is connected to the load to be switched.

The embodiment of the power transistor according to the invention as shown in FIG. 7 represents a parallel circuit of a plurality of low-side switches, i.e, "common-source" products. The source potential of the low-side switches is at ground. The current/voltage supply is effected by the energy source $V_{Battery}$.

Figure 8:
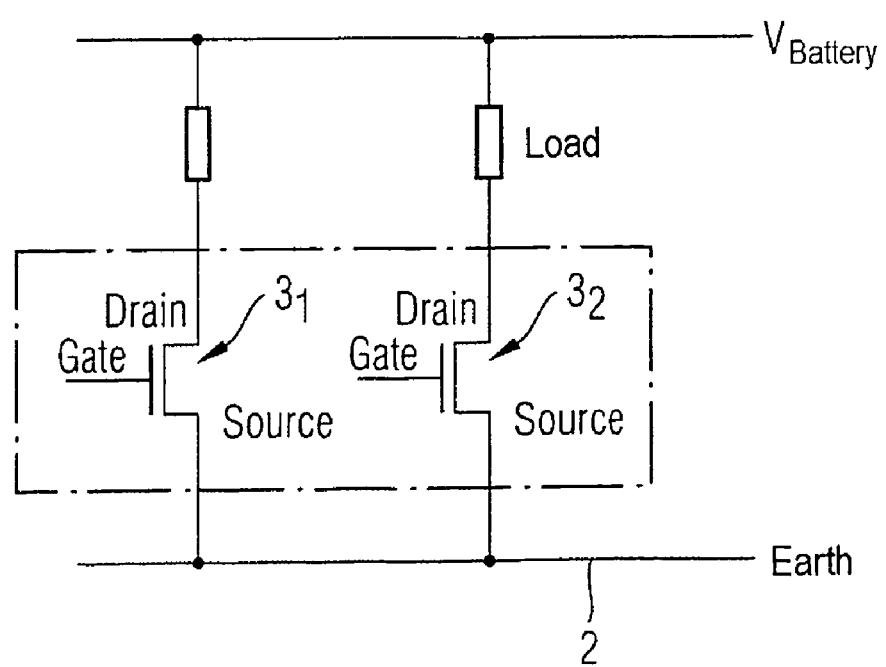
FIG. 8 is a circuit diagram of the power transistor shown in FIG. 7.

The explanations given in connection with FIGS. 3-6 also apply analogously to the embodiments shown in FIGS. 7 and 8.

While the invention has been described in detail and with reference to specific embodiments thereof, it will be apparent to one skilled in the art that various changes and modifications can be made therein without departing from the spirit and scope thereof. For example, some or all of the subject matter may be embodied as software, hardware or a combination thereof. Accordingly, it is intended that the present invention covers the modifications and variations of this invention provided they come within the scope of the appended claims and their equivalents.

What is claimed:

1. A power transistor, comprising:
a leadframe;
a semiconductor chip including a substrate having a thickness and arranged on the leadframe;
a drain contact-making layer provided on a top side of the semiconductor chip;
a source contact-making layer provided on an underside of the semiconductor chip, the source contact-making layer bearing directly on the leadframe; and
a gate contact-making layer provided on the top side of the semiconductor chip, the gate contact-making layer being electrically connected to gate zones via at least one trench filled with conductive material, wherein the gate zones are provided in cell array trenches disposed in a lower region of the semiconductor chip and separated from the at least one trench, and the at least one trench extends through the entire thickness of the substrate of the semiconductor chip such that the gate contact-making layer and the gate zones are located at opposing sides of the substrate.

2. The power transistor according to claim 1, wherein the conductive material is electrically insulated from a semiconductor body of the semiconductor chip.

3. The power transistor according to claim 1, wherein the power transistor is a low-side switch, and the potential of the leadframe is ground.

4. The power transistor according to claim 1, further comprising:
a heat sink connected to the leadframe.

5. The power transistor according to claim 4, wherein the heat sink and the leadframe are configured as a common conductive unit.

6. A power transistor, comprising:
a leadframe;
a plurality of semiconductor chips including substrates arranged on the leadframe;
a drain contact-making layer provided on a top side of each semiconductor chip;
a source contact-making layer provided on an underside of each semiconductor chip, the source contact-making layers bearing directly on the leadframe; and
a gate contact-making layer provided on the top sides of the semiconductor chips, the gate contact-making layer being electrically connected to gate zones via at least one trench filled with conductive material, wherein the gate zones are provided in cell array trenches disposed in a lower region of the semiconductor chips and separated from the at least one trench, and the at least one trench extends through the entire thickness of at least one substrate of the semiconductor chips such that the gate contact-making layer and the gate zones are located at opposing sides of the substrates.

7. The power transistor according to claim 6, wherein each semiconductor chip with the leadframe forms a low-side switch.

8. The power transistor according to claim 6, wherein the semiconductor chips comprise n channel transistors.

9. A power transistor, comprising:
a leadframe;
a semiconductor chip including a substrate having a thickness and arranged on the leadframe;
a drain contact-making layer provided on a top side of the semiconductor chip;
a source contact-making layer provided on an underside of the semiconductor chip, the source contact-making layer bearing directly on the leadframe; and
a gate contact-making layer provided on the top side of the semiconductor chip, the gate contact-making layer being electrically connected to gate zones via at least one trench filled with conductive material, wherein the gate zones are provided in cell array trenches disposed in a lower region and separated from the at least one trench, the gate contact-making layer has a form that tapers in the direction of the top side, and the at least one trench extends through the entire thickness of the substrate of the semiconductor chip such that the gate contact-making layer and the gate zones are located at opposing sides of the substrate.

10. A power transistor, comprising:
a leadframe;
a plurality of semiconductor chips including substrates arranged on the leadframe;
a drain contact-making layer provided on a top side of the semiconductor chips;
a source contact-making layer provided on an underside of each semiconductor chip, the source contact-making layers bearing directly on the leadframe; and
a gate contact-making layer provided on the top sides of the semiconductor chips, the gate contact-making layer being electrically connected to gate zones via at least one trench filled with conductive material, wherein the gate zones are provided in cell array trenches disposed in a lower region of the semiconductor chips and separated from the at least one trench, the gate contact-making layer has a form that tapers in the direction of the top sides and the at least one trench extends through an entire thickness of at least one substrate of the semiconductor chips such that the gate contact-making layer and the gate zones are located at opposing sides of the substrates.

11. The power transistor according to claim 2, wherein the power transistor is a low-side switch, and the potential of the leadframe is ground.

12. The power transistor according to claim 1, wherein the semiconductor chips comprise n channel transistors.

13. The power transistor of claim 1, wherein the cell away trenches are disposed in a layer of the semiconductor chip that is separate from the substrate.

14. The power transistor of claim 6, wherein the cell away trenches are disposed in layers of the semiconductor chips that are separate from the substrates.

15. The power transistor of claim 9, wherein the cell away trenches are disposed in a layer of the semiconductor chip that is separate from the substrate.

16. The power transistor of claim 10, wherein the cell array trenches are disposed in layers of the semiconductor chips that are separate from the substrates.

* * * * *